United States Patent
Kamiyama (10) Patent No.: US 10,985,092 B2
(45) Date of Patent: Apr. 20, 2021

(54) SEMICONDUCTOR DEVICE

(71) Applicant: SHINDENGEN ELECTRIC MANUFACTURING CO., LTD., Chiyoda-ku (JP)

(72) Inventor: Yoshihiro Kamiyama, Hanno (JP)

(73) Assignee: SHINDENGEN ELECTRIC MANUFACTURING CO., LTD., Chiyoda-ku (JP)

(*) Notice: Subject to any disclaimer, the term of this patent is extended or adjusted under 35 U.S.C. 154(b) by 511 days.

(21) Appl. No.: 15/780,443

(22) PCT Filed: Sep. 5, 2017

(86) PCT No.: PCT/JP2017/031996
§ 371 (c)(1),
(2) Date: May 31, 2018

(87) PCT Pub. No.: WO2019/049213
PCT Pub. Date: Mar. 14, 2019

(65) Prior Publication Data
US 2021/0020548 A1    Jan. 21, 2021

(51) Int. Cl.
*H01L 23/495*    (2006.01)
*H01L 25/07*    (2006.01)
(Continued)

(52) U.S. Cl.
CPC .... *H01L 23/49548* (2013.01); *H01L 21/4842* (2013.01); *H01L 23/3107* (2013.01);
(Continued)

(58) Field of Classification Search
CPC ......... H01L 23/49548; H01L 23/49562; H01L 24/40; H01L 23/49575; H01L 23/3107;
(Continued)

(56) References Cited

U.S. PATENT DOCUMENTS

| 6,483,178 | B1 | 11/2002 | Chuang |
| 7,692,285 | B2* | 4/2010 | Sato ............. H01L 23/485 |
| | | | 257/691 |
| 2010/0032819 | A1 | 2/2010 | Liu et al. |
| 2010/0270992 | A1 | 10/2010 | Kawashima et al. |

(Continued)

FOREIGN PATENT DOCUMENTS

| JP | 2004-335776 A | 11/2004 |
| JP | 2010-177619 A | 8/2010 |

(Continued)

OTHER PUBLICATIONS

Netherlands Search Report dated Jan. 9, 2019 in Patent Application No. 2020954 (with English translation and English translation of categories of cited documents).

(Continued)

*Primary Examiner* — Tucker J Wright
(74) *Attorney, Agent, or Firm* — Oblon, McClelland, Maier & Neustadt, L.L.P.

(57) ABSTRACT

A semiconductor device includes: a seal portion; a first electronic element; a first lead terminal; a second lead terminal having one end that is disposed to be close to the one end of the first lead terminal within the seal portion, and another end that is exposed from another end of the seal portion, the other end of the seal portion being along the longitudinal direction; a first connecting element disposed within the seal portion, and having one end that is electrically connected to the first electrode disposed on the first electronic element, and another end that is electrically connected to the one end of the second lead terminal; and a conductive bonding agent.

11 Claims, 6 Drawing Sheets

(51) Int. Cl.
*H01L 23/00* (2006.01)
*H01L 23/31* (2006.01)
*H01L 21/48* (2006.01)

(52) U.S. Cl.
CPC .. *H01L 23/49524* (2013.01); *H01L 23/49562* (2013.01); *H01L 23/49575* (2013.01); *H01L 24/40* (2013.01); *H01L 24/41* (2013.01); *H01L 25/072* (2013.01); *H01L 2224/40105* (2013.01); *H01L 2224/40175* (2013.01); *H01L 2224/40475* (2013.01); *H01L 2224/4103* (2013.01)

(58) Field of Classification Search
CPC ........... H01L 24/41; H01L 2224/40105; H01L 2224/4103; H01L 2224/40175; H01L 2224/40475
See application file for complete search history.

(56) References Cited

U.S. PATENT DOCUMENTS

| | | | |
|---|---|---|---|
| 2010/0273294 | A1 | 10/2010 | Liu et al. |
| 2010/0289127 | A1* | 11/2010 | Kanazawa ........ H01L 23/49575 257/666 |
| 2017/0033055 | A1 | 2/2017 | Watanabe |

FOREIGN PATENT DOCUMENTS

| | | |
|---|---|---|
| JP | 2010-258366 A | 11/2010 |
| JP | 2010-267789 A | 11/2010 |
| JP | 2014-229763 A | 12/2014 |
| JP | 2017-5149 A | 1/2017 |

OTHER PUBLICATIONS

International Search Report dated Nov. 7, 2017 in PCT/JP2017/031996, filed on Sep. 5, 2017 (with Translation of Category of Cited Documents in attached foreign language Search Report).

* cited by examiner

SEMICONDUCTOR DEVICE

TECHNICAL FIELD

The present invention relates to a semiconductor device.

BACKGROUND ART

Inverter devices configured to convert DC power that is inputted from a DC power supply to AC power have conventionally been known as an example of semiconductor devices such as electronic modules.

Such an inverter device is used, for example, to convert a DC voltage to a three-phase AC voltage to drive a three-phase motor. For example, in a conventional semiconductor device, an input/output electrode (source electrode) and a lead terminal (lead frame) of high-side and low-side electronic elements (MOSFETs) are connected with each other with a connecting element (source clip) (for example, see Patent Document 1).

One end of the connecting element is connected to the input/output electrode (source electrode) of the electronic element, and the other end is inserted into a recessed portion formed at one end (island portion) of the lead terminal, and connected with a conductive bonding agent (soldering material).

In the conventional semiconductor device, the conductive bonding agent used in the connection is not blocked and prevented from flowing toward the electronic element. Therefore, if the conductive bonding agent is not melt and solidified at a predetermined position, it may contact the electronic element.

If the conductive bonding agent contacts the electronic element, an electric connection failure occurs, which degrades the reliability of the electronic element.

Furthermore, in order to improve the reliability of the semiconductor device, the semiconductor device needs to be appropriately sealed.

PRIOR ART DOCUMENT

[Patent Document]
[Patent Document 1] JP 2014-229763 A

SUMMARY OF THE INVENTION

Problem to be Solved by the Invention

Under the circumstance, it is an object of the present invention to provide a semiconductor device in which the conductive bonding agent that joins together the connecting element and the lead terminal may be prevented from contacting the electronic element, and an appropriate mold lock may be performed in a sealing process to improve the reliability.

Solution to Problem

A semiconductor device according to an embodiment in an aspect of the present invention includes;
s a seal portion;
a first electronic element disposed in the seal portion;
a second electronic element disposed in the seal portion;
a first lead terminal having one end, on a top surface of which the first electronic element is disposed within the seal portion, and another end that is exposed from the seal portion;
a second lead terminal having one end, on a top surface of which the second electronic element is disposed within the seal portion, and another end that is exposed from the seal portion;
a connecting element having one end that is electrically connected to an input/output electrode of the first electronic element, and another end that is electrically connected to the one end of the second lead terminal; and
a conductive bonding agent for joining together the other end of the connecting element and the top surface of the one end of the second lead terminal,
wherein a groove is formed on the top surface of the one end of the second lead terminal, the groove preventing the conductive bonding agent from flowing toward the second electronic element when the connecting element and the second lead terminal are joined together, and performing a mold lock when the seal portion is sealed.

In the semiconductor device,
the groove includes a first groove portion, into which a sealing member of the seal portion is filled, and a second groove portion formed to be adjacent to the first groove portion for blocking the conductive bonding agent.

In the semiconductor device,
the second groove portion is closer to the other end of the connecting element than the first groove portion is.

In the semiconductor device,
the second groove portion is formed on both sides of the first groove portion.

In the semiconductor device,
a depth of the second groove portion is less than a depth of the first groove portion.

In the semiconductor device,
an inner wall of the first groove portion is tilted so that a width of the first groove portion increases from an opening to a bottom of the first groove portion.

In the semiconductor device,
a bottom of the second groove portion becomes shallower toward the opening of the first groove portion.

In the semiconductor device,
the groove is formed on the top surface of the one end of the second lead terminal in a region between the one end of the connecting element and the second electronic element.

In the semiconductor device,
the groove extends linearly or in a curved manner on the top surface of the one end of the second lead terminal.

In the semiconductor device,
an opening of the second groove portion extends to be adjacent to an opening of the first groove portion.

In the semiconductor device,
the groove extends to surround at least part of a region including the other end of the connecting element or at least part of a region including the second electronic element on the top surface of the one end of the second lead terminal.

In the semiconductor device,
a plurality of grooves are formed on the top surface of the one end of the second lead terminal.

In the semiconductor device,
the conductive bonding agent is a soldering material.

In the semiconductor device,
the first electronic element and the second electronic element are MOSFETs, and the input/output electrode of the first electronic element is a source electrode of the MOSFET.

In the semiconductor device,
a height of the top surface of the one end of the first lead terminal is identical to a height of the top surface of the one end of the second lead terminal.

Effects of the Invention

A semiconductor device according to an aspect of the present invention includes a seal portion, a first electronic element and a second electronic element disposed within the seal portion, a first lead terminal having one end, on a top surface of which the first electronic element is disposed within the seal portion, and another end that is exposed from the seal portion, a second lead terminal having one end, on a top surface of which the second electronic element is disposed within the seal portion, and another end that is exposed from the seal portion, a connecting element (source clip) having one end that is electrically connected to an input/output electrode (source electrode) of the first electronic element and another end that is electrically connected to the one end of the second lead terminal, and a conductive bonding agent for joining together the other end of the connecting element and the top surface of the one end of the second lead terminal.

A groove is formed on the top surface of the one end of the second lead terminal, for preventing the conductive bonding agent from flowing toward the second electronic element when the connecting element and the second lead terminal are joined together, and for performing a mold lock when the seal portion is sealed.

The groove formed on the top surface of the one end of the second lead terminal prevents the conductive bonding agent from flowing toward the second electronic element when the connecting element and the second lead terminal are joined together so that the conductive bonding agent does not contact the second electronic element. The groove also enables a mold lock of the seal portion.

Thus, in a semiconductor device according to the present invention, the conductive bonding agent used in connecting the connecting element and the lead terminal is not prevented from flowing toward the electronic element, and an appropriate mold lock is performed in a sealing process, to improve the reliability.

EMBODIMENTS FOR CARRYING OUT THE INVENTION

Embodiments of the present invention will now be described with reference to the accompanying drawings.

First Embodiment

Figure 1:
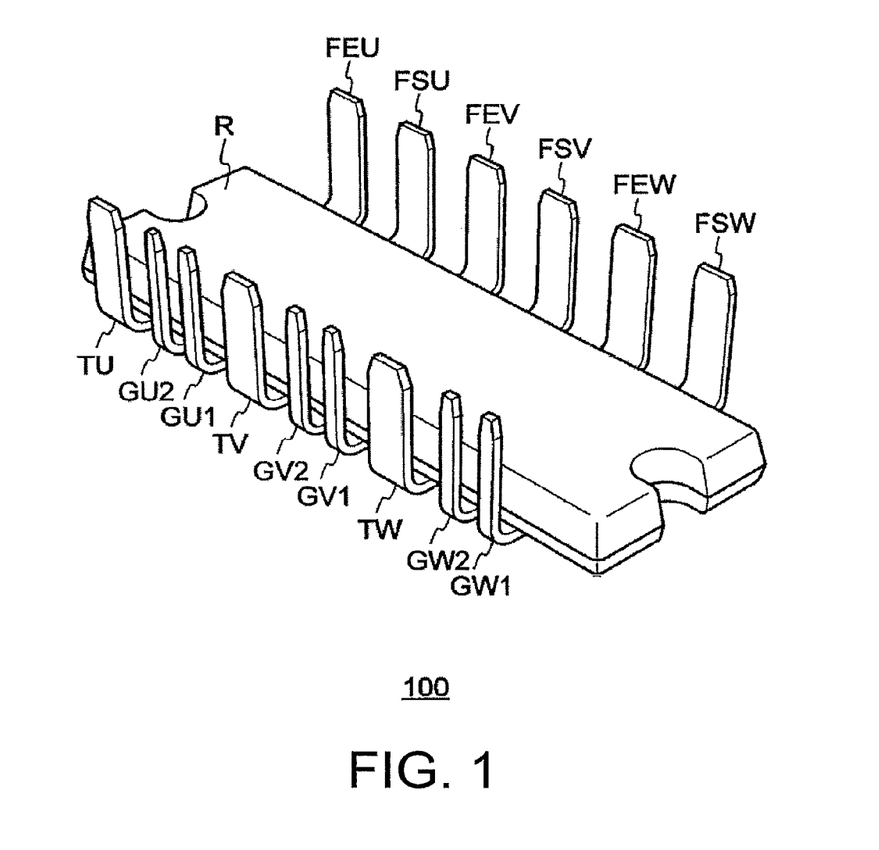
FIG. 1 is a perspective view illustrating an example of an outer appearance of a semiconductor device 100 according to a first embodiment.
Figure 2:
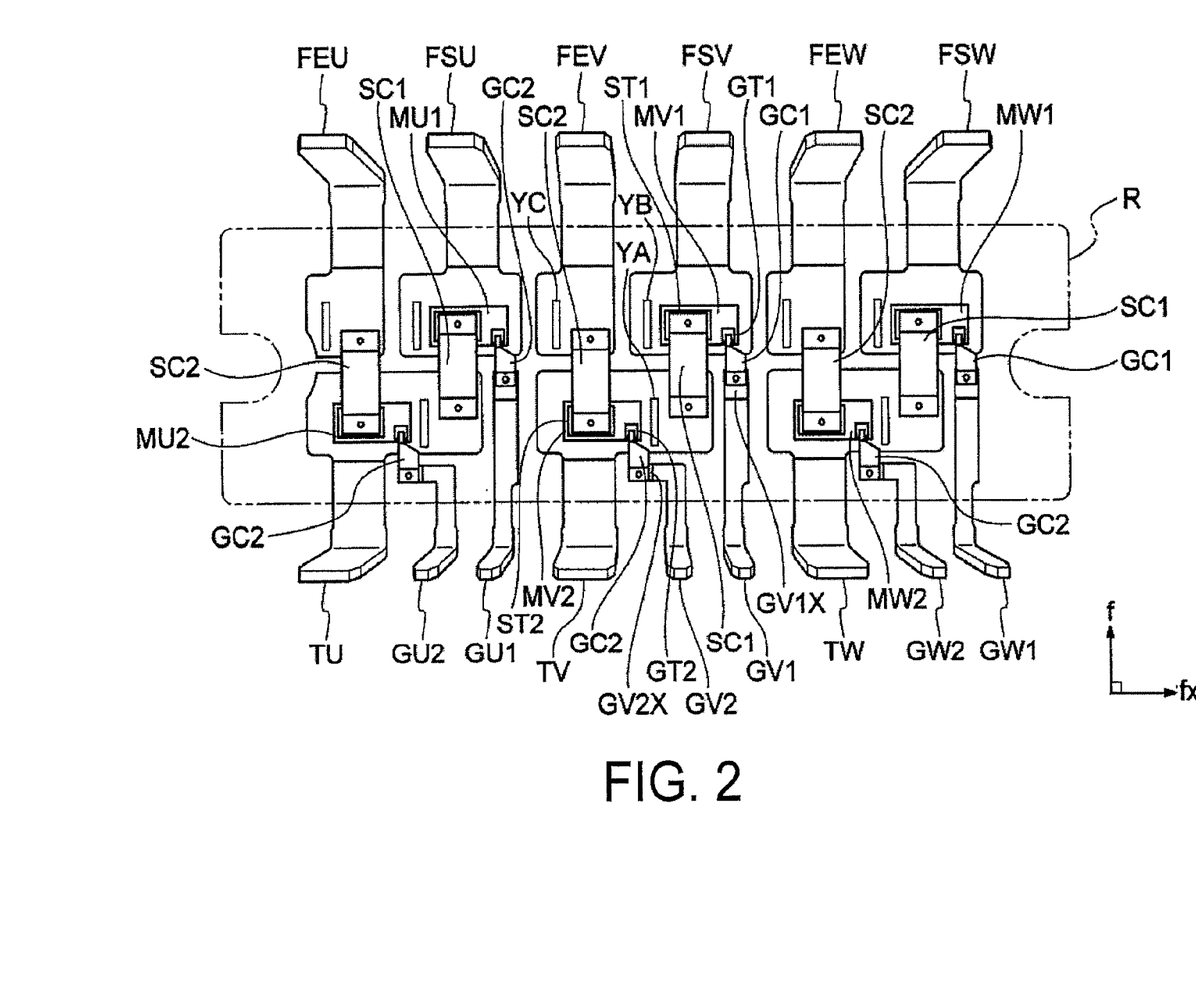
FIG. 2 is a top view illustrating an example of a configuration of the semiconductor device 100 shown in FIG. 1.
Figure 3:
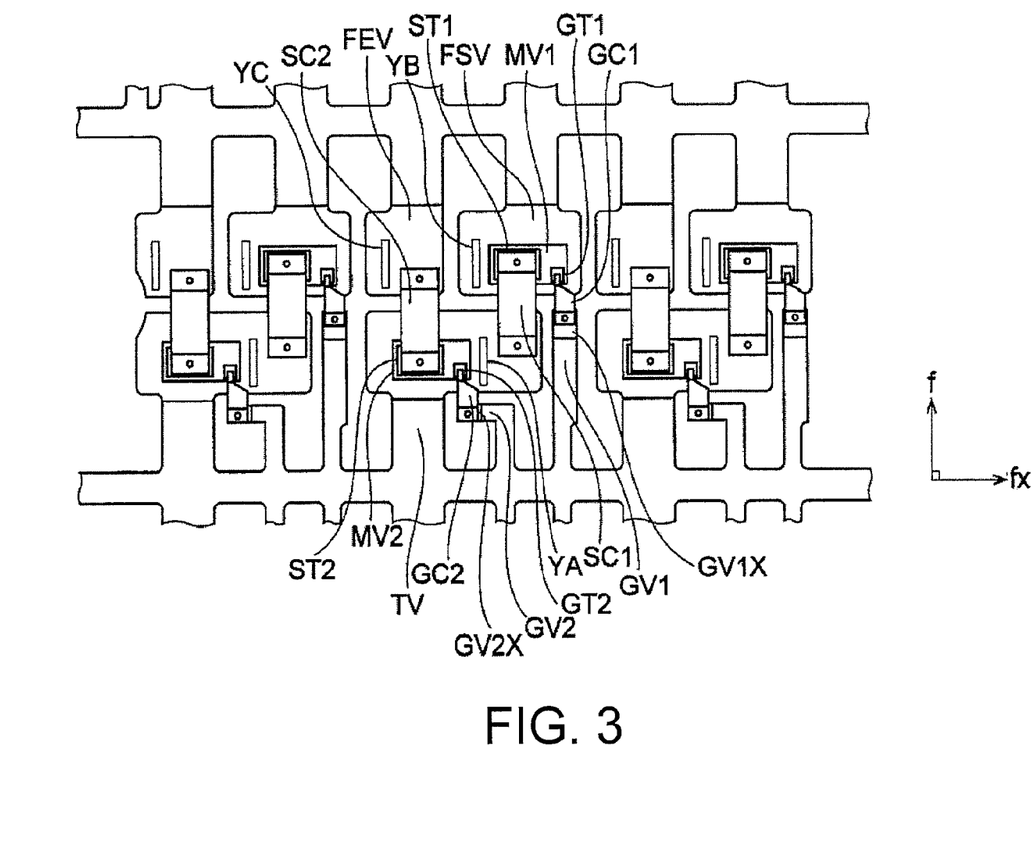
FIG. 3 is a top view illustrating an example of a configuration of electronic elements attached to the lead frame before being sealed.
Figure 4:
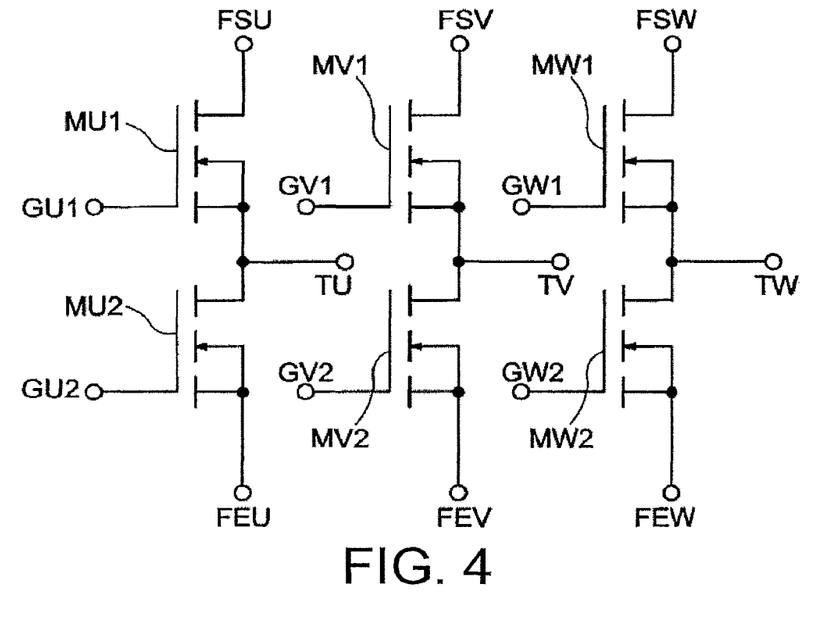
FIG. 4 is a circuit diagram illustrating an example of a circuit configuration of the semiconductor device 100 shown in FIG. 1.

FIG. 1 is a perspective view illustrating an example of an outer appearance of a semiconductor device 100 according to a first embodiment. FIG. 2 is a top view illustrating an example of a configuration of the semiconductor device 100 shown in FIG. 1. FIG. 3 is a top view illustrating an example of a configuration of electronic elements attached to the lead frame before being sealed. FIG. 4 is a circuit diagram illustrating an example of a circuit configuration of the semiconductor device 100 shown in FIG. 1. In FIG. 2, a seal portion R is illustrated to be transparent.

The semiconductor device 100 according to the first embodiment is an inverter device that converts DC power inputted from a DC power supply to AC power, which is outputted.

As shown in FIGS. 1 to 4, the semiconductor device 100 includes a seal portion R, high-side first electronic elements MU1, MV1, and MW1, low-side second electronic elements MU2, MV2, and MW2, power-supply lead terminals (first lead terminals) FSU, FSV, and FSW, ground lead terminals (fifth lead terminals) FEU, FEV, and FEW, input/output lead terminals (second lead terminals) TU, TV, and TW, high-side-gate lead terminals (third lead terminals) GU1, GV1, and GW1, low-side-gate lead terminals (fourth lead terminals) GU2, GV2, and GW2, a high-side first connecting element (gate clip) GC1, a low-side third connecting element (gate clip) GC2, a high-side second connecting element (source clip) SC1, and a low-side fourth connecting element (source clip) SC2.

In the example shown in FIGS. 1 and 2, the power-supply lead terminals FSU, FSV, and FSW, and the ground lead terminals FEU, FEV, and FEW are disposed on one side of the seal portion R and arranged in a longitudinal direction fx, along which a large current from the power supply flows.

One end (inner lead portion) of each of the power-supply lead terminals FSU, FSV, and FSW is sealed by the seal portion R, and the other end (outer lead portion) is connected to a power supply wiring line (not shown) for supplying power.

One end (inner lead portion) of each of the ground lead terminals FEU, FEV, and FEW is sealed by the seal portion R, and the other end (outer lead portion) is connected to a ground wiring line (not shown) that is grounded.

The input/output lead terminals TU, TV, and TW, and the high-side-gate lead terminals GU1, GV1, and GW1 and the low-side-gate lead terminals GU2, GV2, and GW2 for a control operation are disposed on the other side (that faces, in a lateral direction f, the one side that extends along the longitudinal direction fx) and arranged in the longitudinal direction fx of the seal portion R.

As shown in FIG. 2, the high-side first electronic elements MU1, MV1, and MW1 are disposed within the seal portion R. The first electronic elements MU1, MV1, and MW1 are MOSFETs as shown in FIG. 4, for example.

For example, a first electrode (control electrode (gate electrode)) GT1 and a second electrode (source electrode) ST1 are disposed on a top surface of the first electronic element MV1 (FIG. 2). The surface area of the first electrode (gate electrode) GT1 is smaller than that of the second electrode (source electrode) ST1.

The width of the first connecting element GC1 measured in in the longitudinal direction fx of the seal portion R is narrower than that of the second connecting element SC1.

The low-side second electronic elements MU2, MV2, and MW2 are disposed within the seal portion R. The second electronic elements MU2, MV2, and MW2 are MOSFETs as shown in FIG. 4, for example.

For example, a third electrode (control electrode (gate electrode)) GT2 and a fourth electrode (source electrode) ST2 are disposed on a top surface of the second electronic element MV2 (FIG. 2). The surface area of the third electrode (gate electrode) GT2 is smaller than that of the fourth electrode (source electrode) ST2.

The width of the third connecting element GC2 measured in the longitudinal direction fx of the seal portion R is narrower than that of the fourth connecting element SC2.

One end (inner lead portion) of the input/output lead terminal TU is sealed by the seal portion R and connected to the fourth connecting element (source clip) SC2, and the other end (outer lead portion) is connected to a U-phase coil of the motor (FIG. 2).

One end (inner lead portion) of the input/output lead terminal TV is sealed by the seal portion R and connected to the fourth connecting element (source clip) SC2, and the other end (outer lead portion) is connected to a V-phase coil of the motor (FIG. 2).

One end (inner lead portion) of the input/output lead terminal TW is sealed by the seal portion R and connected to the fourth connecting element (source clip) SC2, and the other end (outer lead portion) is connected to a W-phase coil of the motor (FIG. 2).

The width in the longitudinal direction fx of each of the high-side-gate lead terminals (third lead terminals) GU1, GV1, and GW1 to which a control signal (gate voltage) is applied, and the width of each of the low-side-gate lead terminals (fourth lead terminals) GU2, GV2, and GW2 through which a drive current of the motor flows, are narrower than the width in the longitudinal direction fx of each of the lead terminals TU, TV, TW for output, the power-supply lead terminals FSU, FSV, and FSW, and the ground lead terminals FEU, FEV, and FEW.

The semiconductor device 100 according to the first embodiment has a configuration of a three-phase bridge circuit for driving a motor.

For example, as shown in FIG. 4, one end (drain electrode) of the high-side first electronic element (MOSFET) MU1 in the U phase is connected to the power-supply lead terminal FSU, another end (source electrode) is connected to the input/output lead terminal TU via the second connecting element (source clip) SC1, and a control terminal (gate electrode) is connected to the gate lead terminal GU1 via the first connecting element (gate clip) GC1.

One end (drain electrode) of the low-side second electronic element (MOSFET) MU2 in the U phase is connected to the input/output lead terminal TU, another end (source electrode) is connected to the ground lead terminal FEU via the fourth connecting element (source clip) SC2, and a control terminal (gate electrode) is connected to the lead terminal GU2 via the third connecting element (gate clip) GC2.

As shown in FIG. 4, one end (drain electrode) of the high-side first electronic element (MOSFET) MV1 in the V phase is connected to the power-supply lead terminal FSV, another end (source electrode) is connected to the input/output lead terminal TV via the first connecting element (source clip) SC1, and a control terminal (gate electrode) is connected to the gate lead terminal GV1 via the first connecting element (gate clip) GC1.

One end (drain electrode) of the low-side second electronic element (MOSFET) MV2 in the V phase is connected to the input/output lead terminal TV, another end (source electrode) is connected to the ground lead terminal FEV via the fourth connecting element (source clip) SC2, and a control terminal (gate electrode) is connected to the gate lead terminal GV2 via the third connecting element (gate clip) GC2.

As shown in FIG. 4, one end (drain electrode) of the high-side first electronic element (MOSFET) MW1 in the W phase is connected to the power-supply lead terminal FSW, another end (source electrode) is connected to the input/output lead terminal TW via the second connecting element (source clip) SC1, and a control terminal (gate electrode) is connected to a gate lead terminal GW1 via the first connecting element (gate clip) GC1.

One end (drain electrode) of the low-side second electronic element (MOSFET) MW2 in the W phase is connected to the input/output lead terminal TW, another end (source electrode) is connected to the ground lead terminal FEW via the fourth connecting element (source clip) SC2, and a control terminal (gate electrode) is connected to the gate lead terminal GW2 via the first connecting element (gate clip) GC2.

An example of a configuration in the V phase of the semiconductor device 100 will be described in detail below. Configurations of the U phase and the W phase of the semiconductor device 100 are the same as the configuration of the V phase.

For example, as shown in FIG. 2, after the first and second electronic elements MV1 and MV2 are electrically connected to any of the lead terminals FSV, TV, FEV, GV1, and GV2 via any of the connecting elements GC1, SC1, GC2, and SC2, the seal portion R seals a part of each of the lead terminals FSV, TV, FEV, GV1, and GV2, and the first and second electronic elements MV1 and MV2.

The seal portion R is formed of an epoxy resin, for example.

The power-supply lead terminal (first lead terminal) FSV has one end (inner lead portion), on a top surface of which the first electronic element MV1 is disposed within the seal portion R, and the other end (outer lead portion) that is exposed from the one end of the seal portion R, which extends along the longitudinal direction fx, as shown in FIG. 2.

The input/output lead terminal (second lead terminal) TV has one end (inner lead portion), on a top surface of which the second electronic element MV2 is disposed within the seal portion R, and the other end (outer lead portion) that is exposed from the other end of the seal portion R, which extends along the longitudinal direction fx.

The ground lead terminal (fifth lead terminal) FEV has one end (inner lead portion) that is disposed within the seal portion R, and the other end (outer lead portion) that is exposed from the one end of the seal portion R, which extends along the longitudinal direction fx.

As shown in FIG. 2, the high-side-gate lead terminal (third lead terminal) GV1 has one end (inner lead portion) that is disposed in the vicinity of the one end of the first lead terminal FSV within the seal portion R, and the other end (outer lead portion) that is exposed from the other end of the seal portion R, which extends along the longitudinal direction fx.

The low-side-gate lead terminal (fourth lead terminal) GV2 has one end (inner lead portion) that is disposed in the vicinity of the one end (inner lead portion) of the second lead terminal TV within the seal portion R, and the other end (outer lead portion) that is exposed from the other end of the seal portion R, which extends along the longitudinal direction fx.

The width along the longitudinal direction fx of each of the high-side-gate lead terminal (third lead terminal) GV1 and the low-side-gate lead terminal (fourth lead terminal) GV2, to which the control signal (gate voltage) is applied, is narrower than the width along the longitudinal direction fx of each of the output lead terminal TV, the power-supply lead terminal FSV, and the ground lead terminal FEV, through which the drive current of the motor flows.

As described above, the first electronic element (MOSFET) MV1 is disposed within the seal portion R (FIG. 2).

On the top surface of the first electronic element MV1, the first electrode (gate electrode) GT1, which is a control electrode, and the second electrode (source electrode) ST1 are disposed (FIG. 2)

The surface area of the first electrode (gate electrode) GT1 is smaller than that of the second electrode (source electrode) ST1.

An electrode (drain electrode) of the first electronic element MV1, which is not shown, is disposed on a lower surface of the first electronic element MV1 and electrically connected to the top surface of the one end of the first lead terminal FSV.

Figure 5:
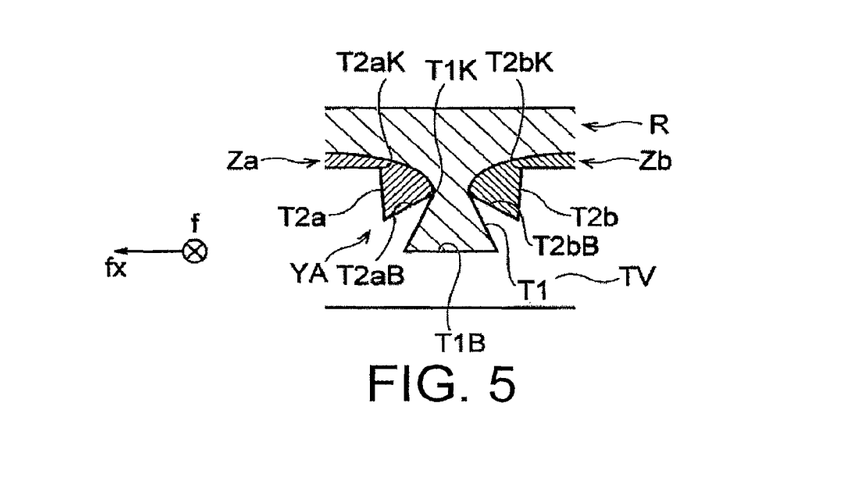
FIG. 5 is a cross-sectional view illustrating an example of a section along the longitudinal direction fx of a groove YA formed in the second lead terminal TV of the semiconductor device 100 shown in FIG. 2.

As shown in FIG. 2, one end of the second connecting element (source clip) SC1 is electrically connected to the second electrode (source electrode) ST1, which is an input/output electrode of the first electronic element MV1, and the other end is electrically connected to the one end of the second lead terminal TV via a conductive bonding agent Zb (FIG. 5).

Furthermore, as shown in FIG. 2, one end of the fourth connecting element (source clip) SC2 is electrically connected to the second electrode (source electrode) ST2, which is an input/output electrode of the second electronic element MV2, and the other end is electrically connected to the one end of the fifth lead terminal FEV via the conductive bonding agent (not shown).

Grooves YA, YB, YC used for blocking the conductive bonding agent during the connection process and performing the mold lock when the seal portion R is sealed are formed on the top surfaces of the one ends of the first, second, and fifth lead terminals FSV, TV, and FEV.

In the example of FIG. 2, the height of the top surface of the one end of the first lead terminal FSV is the same as the height of the top surface of the one ends of the second and fifth lead terminals TV and FEV.

The groove YA will be described in detail as an example, with reference to FIGS. 2 and 5 to 10. The following descriptions also apply to the grooves YB and YC.

Figure 6:
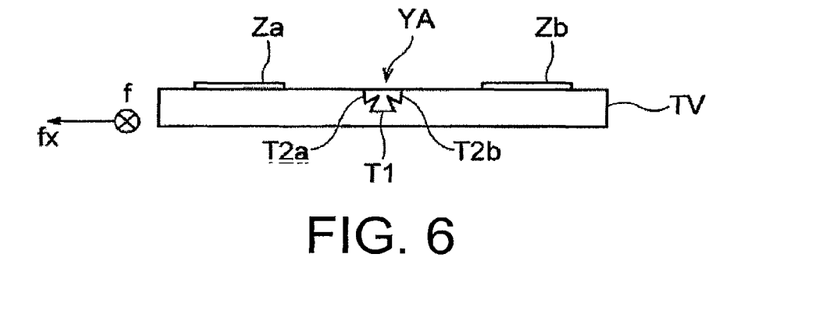
FIG. 6 is a diagram illustrating an example of a structure near the groove YA shown in FIG. 5 before the connection by means of the conductive bonding agent.
Figure 7:
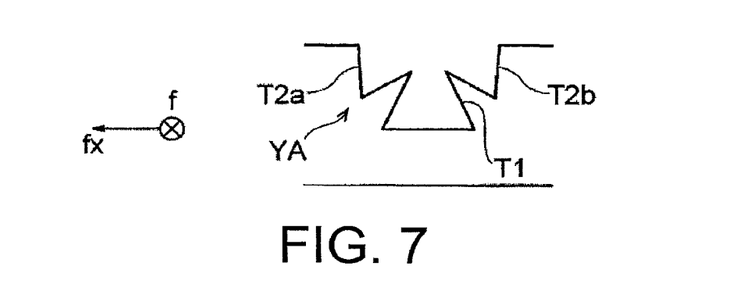
FIG. 7 is a diagram illustrating an example of a structure near the groove YA shown in FIG. 5 after the connection by means of the conductive bonding agent and before the resin-sealing.
Figure 8:
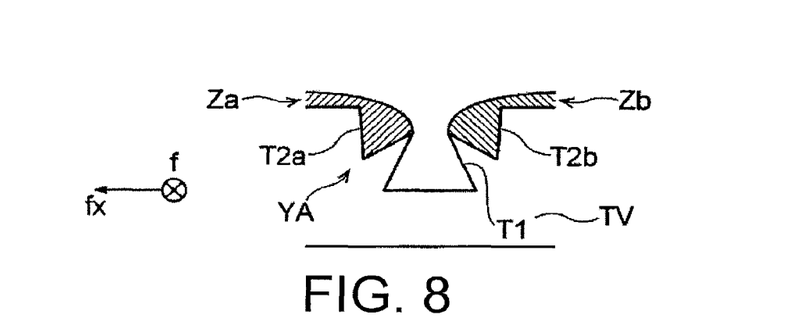
FIG. 8 is a diagram illustrating an example of a structure near the groove YA shown in FIG. 5 after the resin-sealing.
Figure 9:
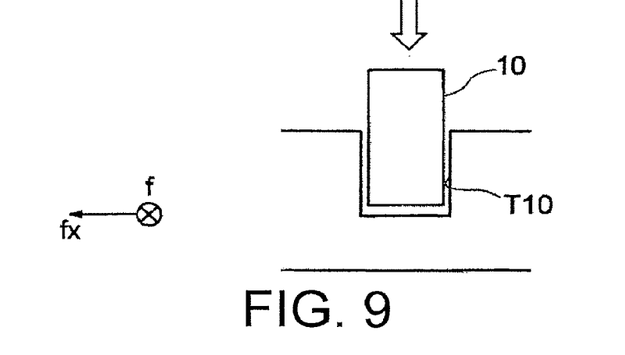
FIG. 9 is a cross-sectional view taken along the longitudinal direction fx, illustrating an example of a process of forming the groove YA shown in FIG. 5.
Figure 10:
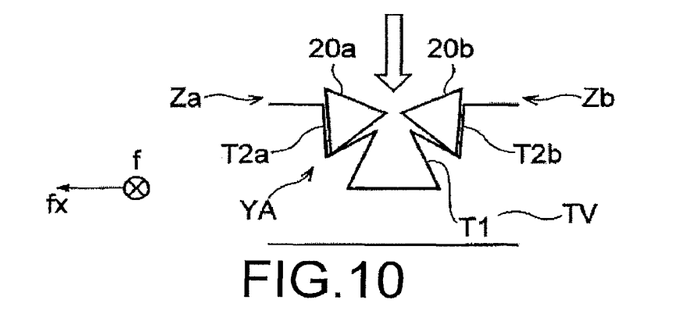
FIG. 10 is a cross-sectional view taken along the longitudinal direction fx, illustrating an example of a process following FIG. 9 of forming the groove YA shown in FIG. 5.

FIG. 5 is a cross-sectional view illustrating an example of a section along the longitudinal direction fx of a groove YA formed in the second lead terminal TV of the semiconductor device 100 shown in FIG. 2. FIG. 6 is a diagram illustrating an example of a structure near the groove YA shown in FIG. 5 before the connection by means of the conductive bonding agent. FIG. 7 is a diagram illustrating an example of a structure near the groove YA shown in FIG. 5 after the connection by means of the conductive bonding agent and before the resin-sealing. FIG. 8 is a diagram illustrating an example of a structure near the groove YA shown in FIG. 5 after the resin-sealing. FIGS. 9 and 10 are cross-sectional views taken along the longitudinal direction fx, illustrating an example of a process of forming the groove YA shown in FIG. 5.

For example, as shown in FIGS. 2 and 5, the groove YA is formed on the top surface of the one end of the second lead terminal TV, for preventing the conductive bonding agent Zb from flowing toward the second electronic element MV2 when the second connecting element SC1 and the second lead terminal are joined together, and performing the mold lock when the seal portion R is sealed.

For example, the groove YA is formed on the top surface of the one end of the second lead terminal TV in a region between the one end of the second connecting element SC1 and the second electronic element MV2, as shown in FIGS. 2 and 6.

Although the groove YA linearly extends along the lateral direction f on the top surface of the one end of the second lead terminal TV in the example of FIG. 2, the groove YA may extend in a curved manner.

The groove TY may extend on the top surface of the one end of the second lead terminal TV to surround at least part of a region including the other end of the second connecting element SC1 or at least part of a region including the second electronic element MV2.

In the example of FIG. 2, one groove YA is formed on the top surface of the one end of the second lead terminal TV. However, a plurality of grooves YA may be formed on the top surface of the one end of the second lead terminal TV.

The groove YA includes, for example, a first groove portion T1 and two second groove portions T2a and T2b, as shown in FIGS. 5 and 6.

The first groove portion T1 extends in the lateral direction f on the top surface of the input/output lead terminal (second lead terminal) TV. A sealing member (sealing resin) of the seal portion R is filled into the first groove portion T1 (FIGS. 2 and 5).

Inner walls of the first groove portion T1 are tilted so that the width of the first groove portion T1 increases from an opening T1K to a bottom T1B of the first groove portion T1 (FIG. 5).

This makes it possible to surely perform a mold lock on the seal portion R at the first groove portion T1.

The two second groove portions T2a and T2b extend in the lateral direction f on both sides of the first groove portion Ta on the top surface of the input/output lead terminal (second lead terminal) TV.

For example, as shown in FIG. 5, the second groove portion T2a,T2b extends in the lateral direction f to be adjacent to the one end of the first groove portion T1. The second groove portion T2a blocks a conductive bonding agent Za for connecting the drain electrode of the second electronic element MV2 and the input/output lead terminal (second lead terminal) TV during the connection process (FIGS. 7 and 8).

The conductive bonding agent Za joins the drain electrode of the second electronic element MV2 and the top surface of the one end of the second lead terminal TV in a conductive manner. The conductive bonding agent Za is, for example, a soldering material.

The second groove portion T2a is disposed to be closer to the drain electrode of the second electronic element MV2 than the first groove portion T1 is, as shown in FIG. 5, for example.

This enables the second groove portion T2a to block the conductive bonding agent Za more reliably.

The depth of the second groove portion T2a is less than the depth of the first groove portion T1.

The second groove portion T2a has a bottom T2aB that becomes shallower toward the opening T1K of the first groove portion T1.

The second groove portion T2a also has an opening T2aK that is adjacent to and extends along the opening T1K of the first groove portion T1.

Furthermore, as shown in FIG. 5, the second groove portion T2b2 extends in the lateral direction f to be adjacent to the other side of the first groove portion T1. The second groove portion T2b blocks the conductive bonding agent Zb for connecting the other end of the second connecting element SC1 and the input/output lead terminal (second lead terminal) TV during the connection process (FIGS. 7 and 8).

The conductive bonding agent Zb joins the other end of the second connecting element SC1 and the top surface of the one end of the second lead terminal TV in a conductive manner. The conductive bonding agent Zb is, for example, a soldering material.

The second groove portion T2b is disposed to be closer to the other end of the second connecting element SC1 than the first groove portion T1 is, as shown in FIG. 5, for example.

This enables the second groove portion T2b to block the conductive bonding agent Zb more reliably.

The depth of the second groove portion T2b is less than the depth of the first groove portion T1.

The second groove portion T2b has a bottom T2bB that becomes shallower toward the opening T1K of the first groove portion T1.

The second groove portion T2b also has an opening T2bK that is adjacent to and extends along the opening T1K of the first groove portion T1.

The groove YA with the above-described structure is formed, for example, by pressing a first processing member 10 onto the surface of the one end of the second lead terminal TV as shown in FIG. 9 to form a reference groove T10, and then pressing second processing members 20a and 20b with a cross-section that has a pointed tip to both sides of the reference groove 10 as shown in FIG. 10 to form the first groove portion T1 and the second groove portions T2a and T2b.

As described above, the grooves YB and YC are formed on the top surface of the first lead terminal FSV and the top surface of the fifth lead terminal FEV (FIG. 2). The grooves YB and YC have the same structure as the groove YA.

Figure 11:
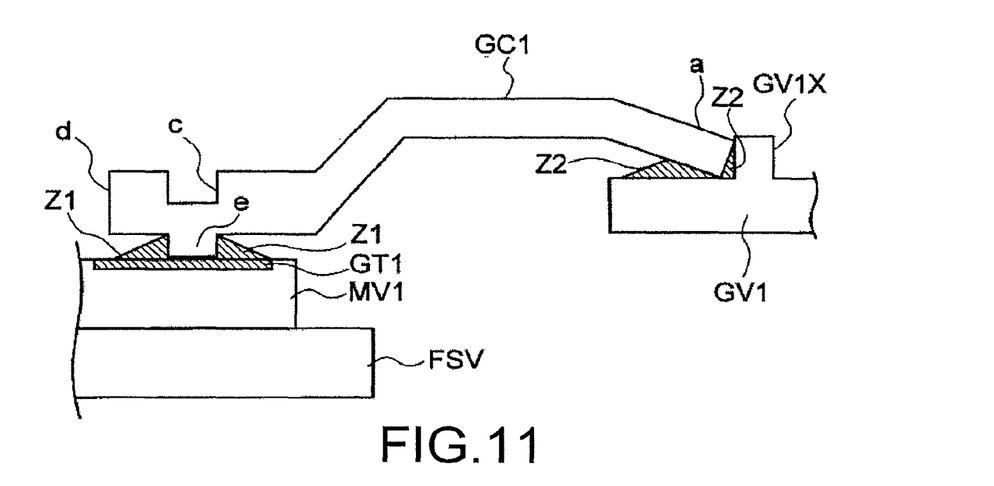
FIG. 11 is a cross-sectional view illustrating an example of a structure of a gate clip connected between the electronic element and the lead terminal shown in FIG. 2.

An example the structure of the gate clip connected between the electronic element and the lead terminal shown in FIG. 2 will next be described. FIG. 11 is a cross-sectional view illustrating an example of the structure of the gate clip connected between the electronic element and the lead terminal shown in FIG. 2.

For example, as shown in FIG. 11, the height of the top surface of the one end of the third lead terminal GV1 is higher than the height of the top surface of the first electrode (gate electrode) GT1 included in the first electronic element MV1.

The thickness of the first lead terminal FSV is the same as the thickness of the third lead terminal GV1 (FIG. 11).

As shown in FIG. 2, the first connecting element (gate clip) GC1 is disposed within the seal portion R.

The first connecting element GC1 has one end d that is electrically connected to the electrode (gate electrode) GT1 of the first electronic element MV1 with a conductive bonding agent Z1, as shown in FIG. 11.

In the example of FIG. 11, a protrusion e on the lower surface side of the one end d of the first connecting element GC1 is electrically connected to the electrode (gate electrode) GT1 of the first electronic element MV1 with the conductive bonding agent Z1.

The protrusion e is formed by pressing the one end d of the first connecting element GC1 from the top surface side. A concave c is formed by the pressing on the side opposite to the protrusion at the one end d of the first connecting element GC1.

The conductive bonding agent Z1 joins the other end of the first connecting element GC1 and the one end of the second lead terminal GV1 in a conductive manner. The conductive bonding agent Z1 is, for example, a soldering material.

As shown in FIG. 11, the other end a of the first connecting element (gate clip) GC1 is electrically connected to the one end of the third lead terminal GV1 with a conductive bonding agent Z2.

The conductive bonding agent Z2 joins the other end of the first connecting element GC1 and the one end of the third lead terminal GV1 in a conductive manner. The conductive bonding agent Z2 is, for example, a soldering material.

Furthermore, as shown in FIG. 2, the second connecting element (source clip) SC1 is disposed within the seal portion. The second connecting element SC1 has one end that is electrically connected to the second electrode disposed on the top surface of the first electronic element, and the other end that is electrically connected to the one end of the second lead terminal and extends in an extending direction (lateral direction f).

As described above, the surface area of the first electrode (gate electrode) GT1 is smaller than that of the second electrode (source electrode) ST1.

Furthermore, in the longitudinal direction fx in the seal portion R, the width of the first connecting element GC1 is narrower than the width of the second connecting element SC1 (FIG. 2).

The drive current of the motor flows through the second connecting element SC1, which is a source clip, and the control signal (gate voltage) is applied to the first connecting element GC1, which is a gate clip.

Therefore, the width (size) of the wiring path of the first connecting element GC1 is narrower (smaller) than the width (size) of the wiring path of the second connecting element SC1, and the surface area of the first electrode (gate electrode) GT1 is smaller than the surface area of the second electrode (source electrode) ST1.

A wall portion GV1X protrudes from the top surface of the one end of the third lead terminal GV1 (FIG. 11).

When the other end of the first connecting element GC1 and the one end of the third lead terminal GV1 are joined to each other, the wall portion GV1X blocks the conductive bonding agent Z2 that is melted.

The wall portion GV1X of the third lead terminal GV1 is in contact with the other end a of the first connecting element GC1. In the example of FIG. 11, the other end a of the first connecting element GC1 is bent downward to contact the wall portion GV1X.

The conductive bonding agent Z2 is drawn to the wall portion GV1X by surface tension force, so that the other end a, which is bent downward, of the first connecting element GC1 is fixed at a predetermined position.

The wall portion GV1X is disposed on the top surface of the one end of the third lead terminal GV1 so as to be perpendicular (extend in the longitudinal direction fx) to the direction (the lateral direction f) along which the one end of the third lead terminal GV1 extends, as shown in FIGS. 2 and 11, for example.

A plurality of wall portions GV1X may be disposed on the top surface of the one end of the third lead terminal GV1.

In the example of FIG. 2, the length of the wall portion GV1X is the same as the width of the one end of the third lead terminal GV1.

This prevents the conductive bonding agent Z2 from flowing around the wall portion GV1X to the opposite side of the third lead terminal GV1.

The conductive bonding agent Z2 is brought into contact with the wall portion GV1X by the surface tension force when the one end (inner lead portion) of the third lead terminal GV1 and the other end of the first connecting element GC1 are joined together.

Since the wall portion GV1X determines the position at which the first connecting element GC1 is joined to the third lead terminal GV1, the first connecting element GC1 is joined at a predetermined position. The wall portion GV1X fixes (by mold lock) the third lead terminal GV1.

As a result, the first connecting element (gate clip) GC1 and the first electrode (gate electrode) GT1 are surely joined by soldering at the predetermined position, which may prevent the one end d of the first connecting element (gate clip) GC1 from being electrically connected to other wiring portion.

Furthermore, as shown in FIG. 11, the height (the position of the top surface) of the wall portion GV1X on the top surface of the one end of the third lead terminal GV1 is higher than the height (the position of the top surface) of the conductive bonding agent Z2 on the top surface of the one end of the third lead terminal GV1.

Thus, the conductive bonding agent Z2 does not flow over the wall portion GV1X on the top surface of the one end of the third lead terminal GV1 when the one end (inner lead portion) of the third lead terminal GV1 and the other end of the first connecting element GC1 are joined together.

As shown in FIG. 2, the second electronic element (MOSFET) MV2 is disposed within the seal portion R.

As described above, the third electrode (gate electrode) GT2, which is a control electrode, and the fourth electrode (source electrode) ST2 are disposed on the top surface of the second electronic element MV2 (FIG. 2).

The surface area of the third electrode (gate electrode) GT2 is smaller than that of the fourth electrode (source electrode) ST2.

The electrode (drain electrode) that is not shown is disposed on the lower surface of the second electronic element MV2 and electrically connected to the top surface of the one end of the second lead terminal TV.

The width of the third connecting element GC2 in the longitudinal direction fx in the seal portion R is narrower than the width of the fourth connecting element SC2 (FIG. 2).

The drive current of the motor flows through the fourth connecting element SC2, which is a source clip, and the control signal (gate voltage) is applied to the third connecting element GC2, which is a gate clip. Therefore, the width (size) of the wiring path of the third connecting element GC2 is narrower (smaller) than that of the fourth connecting element SC2, and the surface area of the third electrode (gate electrode) GT2 is smaller than that of the fourth electrode (source electrode) ST2.

As shown in FIG. 2, the third connecting element GC2 is disposed within the seal portion R, and has one end that is electrically connected to the third electrode GT2 of the second electronic element MV2, and the other end that is connected to the one end of the fourth lead terminal GV2.

As shown in FIG. 2, the fourth connecting element SC2 is disposed within the seal portion R. The fourth connecting element SC2 has one end that is electrically connected to the fourth electrode (source electrode) ST2 disposed on the top surface of the second electronic element MV2, and the other end that is electrically connected to the one end of the fifth lead terminal FEV. The fourth connecting element SC2 extends in the lateral direction f.

A wall portion GV2X protrudes from the top surface of the one end of the fourth lead terminal GV2 (FIG. 2).

The wall portion GV2X blocks a conductive bonding agent (not shown) when the other end of the third connecting element GC2 and the one end of the fourth lead terminal GV2 are joined together.

The wall portion GV2X is disposed on the top surface of the one end of the fourth lead terminal GV2 so as to be perpendicular (lateral direction f) to the direction (extend in the longitudinal direction fx) along which the one end of the fourth lead terminal GV2 extends, as shown in FIG. 2.

A plurality of wall portions GV2X may be disposed on the top surface of the one end of the fourth lead terminal GV2.

In the example of FIG. 2, the length of the wall portion GV2X is the same as the width of the one end of the fourth lead terminal GV2.

The other features in the structures of the third and fourth connecting elements GC2 and SC2 are the same as those of the first and second connecting elements GC1 and SC1, for example.

As described above, the V phase of the semiconductor device 100 according to the embodiment has been described with reference to FIGS. 2 and 5 to 11. The structures of the U phase and the W phase of the semiconductor device 100 are the same as the structure of the V phase.

As described above, a semiconductor device according to an aspect of the present invention includes a seal portion, a first electronic element and a second electronic element disposed within the seal portion, a first lead terminal having one end, on a top surface of which the first electronic element is disposed within the seal portion, and another end that is exposed from the seal portion, a second lead terminal having one end, on a top surface of which the second electronic element is disposed within the seal portion, and another end that is exposed from the seal portion, a connecting element (source clip) having one end that is electrically connected to an input/output electrode (source electrode) of the first electronic element and another end that is electrically connected to the one end of the second lead terminal, and a conductive bonding agent for joining together the other end of the connecting element and the top surface of the one end of the second lead terminal.

A groove is formed on the top surface of the one end of the second lead terminal, for preventing the conductive bonding agent from flowing toward the second electronic element when the connecting element and the second lead terminal are joined together, and for performing a mold lock when the seal portion is sealed.

The groove formed on the top surface of the one end of the second lead terminal prevents the conductive bonding agent from flowing toward the second electronic element when the connecting element and the second lead terminal are joined together so that the conductive bonding agent does not contact the second electronic element. The groove also enables a mold lock of the seal portion.

Thus, in a semiconductor device according to the present invention, the conductive bonding agent used in connecting the connecting element and the lead terminal is not prevented from flowing toward the electronic element, and an appropriate mold lock is performed in a sealing process, to improve the reliability.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor device
R: seal portion
MU1: high-side first electronic element
MV1: high-side first electronic element
MW1: high-side first electronic element
MU2: low-side second electronic element
MV2: low-side second electronic element
MW2: low-side second electronic element
FSU: power-supply lead terminal
FSV: power-supply lead terminal
FSW: power-supply lead terminal
FEU: ground lead terminal
FEV: ground lead terminal
FEW: ground lead terminal
TU: input/output lead terminal
TV: input/output lead terminal
TW: input/output lead terminal
GU1: high-side-gate lead terminal
GV1: high-side-gate lead terminal
GW1: high-side-gate lead terminal
GU2: low-side-gate lead terminal
GV2: low-side-gate lead terminal
GW2: low-side-gate lead terminal
GC1: high-side first connecting element (gate clip)
GC2: low-side third connecting element (gate clip)
SC1: high-side second connecting element (source clip)
SC2: low-side fourth connecting element (source clip)

The invention claimed is:

1. A semiconductor device, comprising:
a seal portion;
a first electronic element disposed in the seal portion;
a second electronic element disposed in the seal portion;
a first lead terminal having one end, on a top surface of which the first electronic element is disposed within the seal portion, and another end that is exposed from the seal portion;
a second lead terminal having one end, on a top surface of which the second electronic element is disposed within the seal portion, and another end that is exposed from the seal portion;
a connecting element having one end that is electrically connected to an input/output electrode of the first electronic element, and another end that is electrically connected to the one end of the second lead terminal; and
a first conductive bonding agent for joining together the other end of the connecting element and the top surface of the one end of the second lead terminal,
wherein a groove is formed on the top surface of the one end of the second lead terminal, the groove preventing the first conductive bonding agent from flowing toward the second electronic element when the connecting element and the second lead terminal are joined together, and performing a mold lock when the seal portion is sealed,
wherein the groove is formed on the top surface of the one end of the second lead terminal in a region between the one end of the connecting element and the second electronic element,
wherein the groove includes
a first groove portion, into which a sealing member of the seal portion is filled, and
second groove portions formed to be adjacent to the first groove portion for blocking the first conductive bonding agent,
wherein the second groove portions are formed on both sides of the first groove portion,
wherein one of the second groove portions is closer to the other end of the connecting element than the first groove portion is, and blocks the first conductive bonding agent for connecting the other end of the connecting element and the second lead terminal during a connection process, and
wherein the other of the second groove portions is closer to an electrode of the second electronic element than the first groove portion is, and blocks a second conductive bonding agent for connecting the electrode of the second electronic element and the second lead terminal during a connection process.

2. The semiconductor device according to claim 1, wherein a depth of the second groove portion is less than a depth of the first groove portion.

3. The semiconductor device according to claim 2, wherein an inner wall of the first groove portion is tilted so that a width of the first groove portion increases from an opening to a bottom of the first groove portion.

4. The semiconductor device according to claim 3, wherein a bottom of the second groove portion becomes shallower toward the opening of the first groove portion.

5. The semiconductor device according to claim 1, wherein the groove extends linearly or in a curved manner on the top surface of the one end of the second lead terminal.

6. The semiconductor device according to claim 5, wherein an opening of the second groove portion extends to be adjacent to an opening of the first groove portion.

7. The semiconductor device according to claim 1, wherein the groove extends to surround at least part of a region including the other end of the connecting element or at least part of a region including the second electronic element on the top surface of the one end of the second lead terminal.

8. The semiconductor device according to claim 1, wherein a plurality of grooves are formed on the top surface of the one end of the second lead terminal.

9. The semiconductor device according to claim 1, wherein the first conductive bonding agent is a soldering material.

10. The semiconductor device according to claim 1, wherein the first electronic element and the second electronic element are MOSFETs, and the input/output electrode of the first electronic element is a source electrode of the MOSFET.

11. The semiconductor device according to claim 1, wherein a height of the top surface of the one end of the first lead terminal is identical to a height of the top surface of the one end of the second lead terminal.

* * * * *